(12) United States Patent
Kitahara

(10) Patent No.: US 12,341,051 B2
(45) Date of Patent: Jun. 24, 2025

(54) MANUFACTURING METHOD OF SEMICONDUCTOR DEVICE

(71) Applicant: FUJI ELECTRIC CO., LTD., Kanagawa (JP)

(72) Inventor: Kazuhiro Kitahara, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 614 days.

(21) Appl. No.: 17/700,527

(22) Filed: Mar. 22, 2022

(65) Prior Publication Data
US 2022/0384235 A1 Dec. 1, 2022

(30) Foreign Application Priority Data
May 28, 2021 (JP) .................. 2021-090568

(51) Int. Cl.
*H01L 21/304* (2006.01)
*H01L 21/683* (2006.01)

(52) U.S. Cl.
CPC ........ *H01L 21/6835* (2013.01); *H01L 21/304* (2013.01); *H01L 2221/68327* (2013.01); *H01L 2221/6834* (2013.01)

(58) Field of Classification Search
CPC . H01L 21/6835; H01L 21/683; H01L 21/304; H01L 21/30625; H01L 21/6836; H01L 21/6833; H01L 29/0696; H01L 29/06; H01L 29/66348; H01L 29/66; H01L 29/7397; H01L 29/73; H01L 2221/68327;
(Continued)

(56) References Cited

U.S. PATENT DOCUMENTS

| 5,279,771 A | 1/1994 | Lee |
| 9,653,412 B1 | 5/2017 | Nakata |
| 10,755,933 B2 | 8/2020 | Takishita |

(Continued)

FOREIGN PATENT DOCUMENTS

| JP | S6466968 A | 3/1989 |
| JP | H04289866 A | 10/1992 |

(Continued)

OTHER PUBLICATIONS

Office Action issued for counterpart Japanese Application No. 2021-090568, transmitted from the Japanese Patent Office on Dec. 24, 2024 (drafted on Dec. 17, 2024).

*Primary Examiner* — Nikolay K Yushin

(57) ABSTRACT

Provided is a manufacturing method of a semiconductor device comprising a semiconductor substrate which includes a first surface and a second surface which is on an opposite side of the first surface, the method comprising: a front surface processing for providing a first resist to the first surface of the semiconductor substrate and processing the first surface; a first protective film forming for forming a first protective film above the first surface of the semiconductor substrate; a second protective film forming for forming a second protective film above the first protective film, wherein a material of the second protective film is different from that of the first protective film; a back surface processing for processing the second surface of the semiconductor substrate; and a protective film removing for selectively removing the second protective film.

21 Claims, 9 Drawing Sheets

(58) Field of Classification Search
CPC ..... H01L 2221/6834; H01L 2221/6835; H01L 2221/68368; H01L 2221/68386
See application file for complete search history.

(56) References Cited

U.S. PATENT DOCUMENTS

| | | | |
|---|---|---|---|
| 11,328,998 B2* | 5/2022 | Wakisaka | ............ H01L 23/5384 |
| 11,360,384 B2* | 6/2022 | Yang | ..................... G03F 7/2002 |
| 2010/0167540 A1 | 7/2010 | Sakuma | |
| 2013/0196457 A1 | 8/2013 | Nakajima | |
| 2014/0111270 A1 | 4/2014 | Lu | |
| 2017/0076948 A1 | 3/2017 | Nakata | |
| 2017/0250162 A1 | 8/2017 | Soga | |
| 2020/0103745 A1* | 4/2020 | Yang | ......................... G03F 1/24 |
| 2021/0082820 A1* | 3/2021 | Wakisaka | ................ H01L 21/56 |

FOREIGN PATENT DOCUMENTS

| | | |
|---|---|---|
| JP | H05304138 A | 11/1993 |
| JP | 2006054349 A | 2/2006 |
| JP | 2007214387 A | 8/2007 |
| JP | 2008124354 A | 5/2008 |
| JP | 2009114268 A | 5/2009 |
| JP | 2014086600 A | 5/2014 |
| JP | 2017059636 A | 3/2017 |
| JP | 2017112158 A | 6/2017 |
| JP | 2017152602 A | 8/2017 |
| WO | 2012042653 A1 | 4/2012 |
| WO | 2016171245 A1 | 10/2016 |
| WO | 2018179798 A1 | 10/2018 |

* cited by examiner

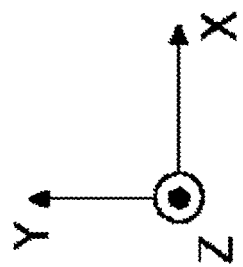
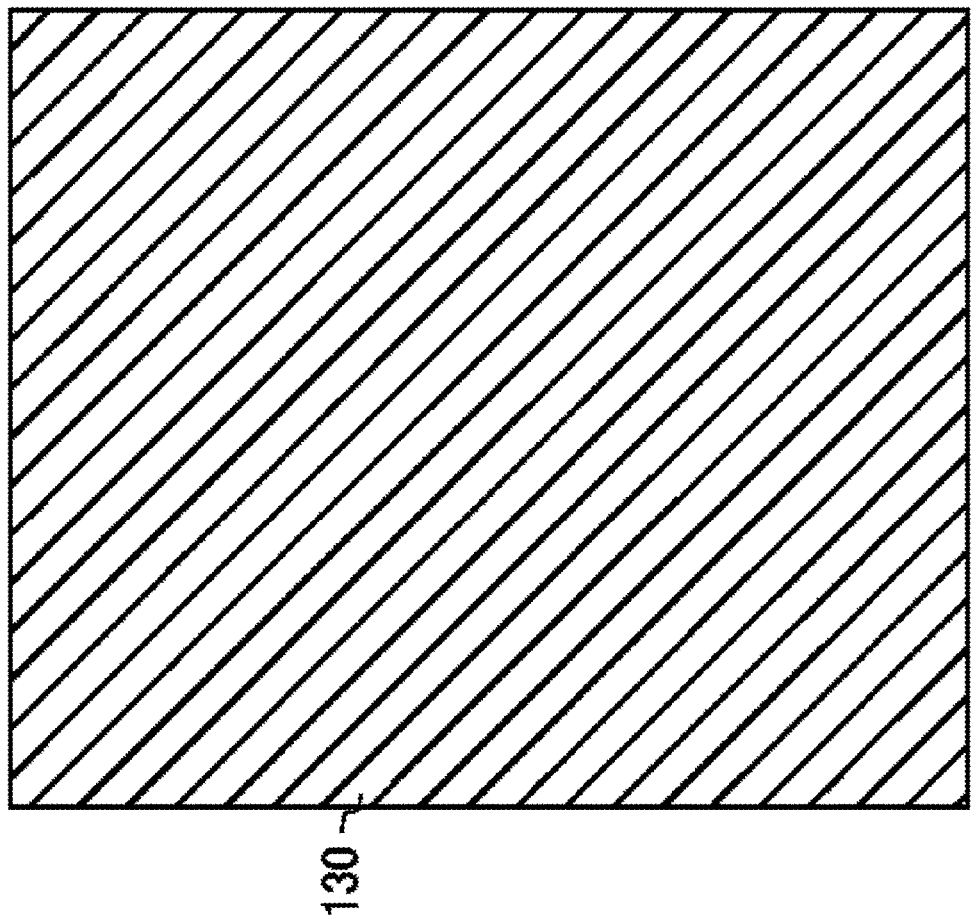
FIG.7

MANUFACTURING METHOD OF SEMICONDUCTOR DEVICE

The contents of the following Japanese patent application are incorporated herein by reference:
NO. 2021-090568 filed in JP on May 28, 2021.

BACKGROUND

1. Technical Field

The present invention relates to a manufacturing method of a semiconductor device.

2. Related Art

Conventionally, in a manufacturing method of a semiconductor device, a technology for "after covering an ultraviolet curable resin film as a protective film on a surface in which a device is formed and causing the ultraviolet curable resin film to be irradiated with ultraviolet to be cured, causing the ultraviolet curable resin film to contact a removable supporting fixture to be fixed to the fixture" is known (For example, see Patent Document 1).

Patent Document 1; Japanese Patent Application Publication No. 2008-124354

BRIEF DESCRIPTION OF THE DRAWINGS

FIG. 7 is a diagram showing one example of a positioning of a second protective film 130 in a second protective film forming step S203.

DESCRIPTION OF EXEMPLARY EMBODIMENTS

Figure 1:
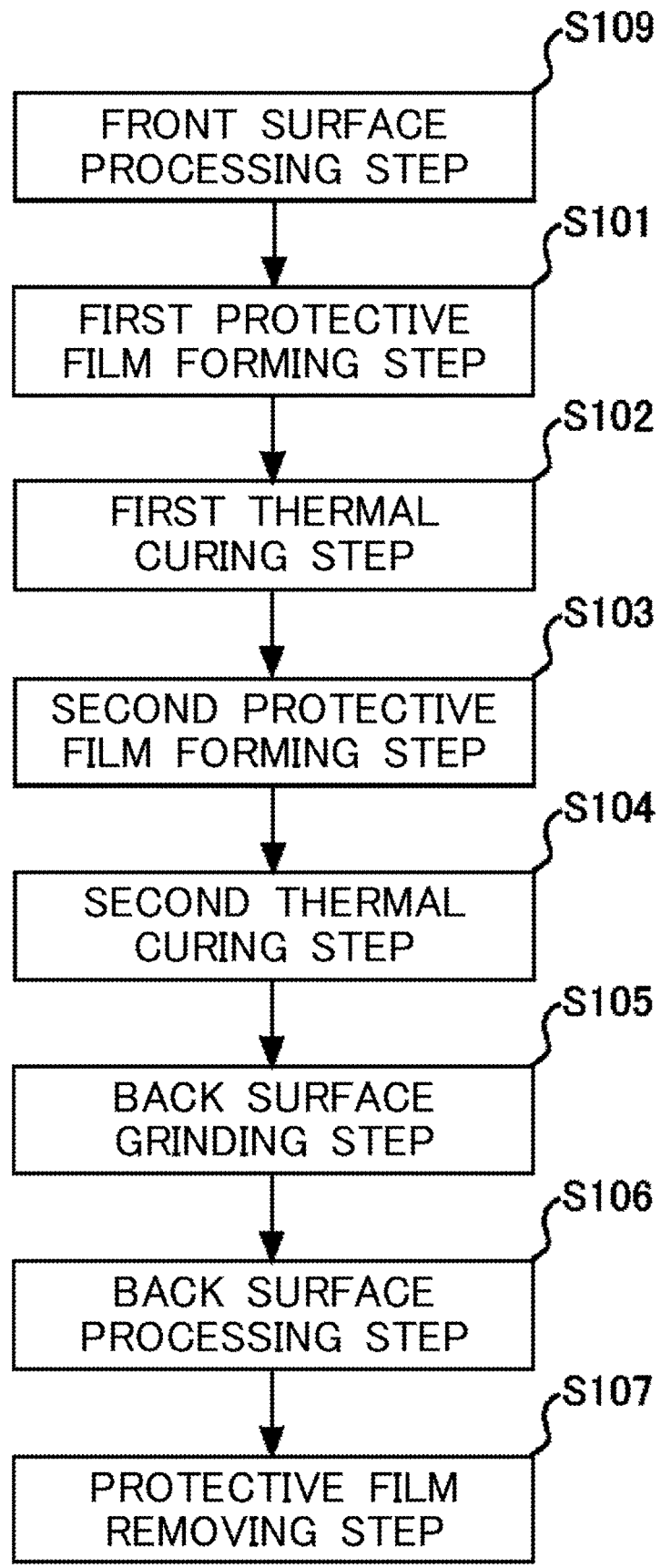
FIG. 1 is a diagram illustrating one example of a flow chart of a manufacturing method of a semiconductor device 100.

Hereinafter, the present invention will be described through embodiments of the invention, but the following embodiments do not limit the invention according to claims. In addition, not all combinations of features described in the embodiments are essential to the solution of the invention. Note that, in the present specification and the drawings, a repeated description for an element having a substantially same function and configuration is omitted by providing a same reference numeral, and illustration of an element which is not directly associated with the present invention is omitted. Also, in one drawing, an element having the same function and configuration may be provided with a representative reference numeral, omitting the reference numerals for the others.

As used herein, one side in a direction parallel to a depth direction of a semiconductor substrate is referred to as "upper" and the other side is referred to as "lower". One surface of two principal surfaces of a substrate, a layer or other member is referred to as an upper surface, and the other surface is referred to as a lower surface. An "upper" and "lower" direction is not limited to a direction of gravity, or a direction at the time in which the semiconductor module is implemented.

In the present specification, technical matters may be described using orthogonal coordinate axes of an X axis, a Y axis, and a Z axis. The orthogonal coordinate axes merely identify relative positions of the components, and do not limit a specific direction. For example, the Z axis is not limited to indicate the height direction with respect to the ground. Note that a +Z axis direction and a −Z axis direction are directions opposite to each other. When the Z axis direction is described without describing the signs, it means that the direction is parallel to the +Z axis and the −Z axis. In the present specification, orthogonal axes parallel to the upper surface and the lower surface of the semiconductor substrate are referred to as an X axis and a Y axis. In addition, an axis perpendicular to the upper surface and the lower surface of the semiconductor substrate is referred to as a Z axis. In the present specification, the direction of the Z axis may be referred to as the depth direction. In addition, in the present specification, a direction parallel to the upper surface and the lower surface of the semiconductor substrate may be referred to as a horizontal direction, including an X axis direction and a Y axis direction.

In the present specification, a case where a term such as "same" or "equal" is mentioned may include a case where an error due to a variation in manufacturing or the like is included. The error is, for example, within 10%.

Figure 2:
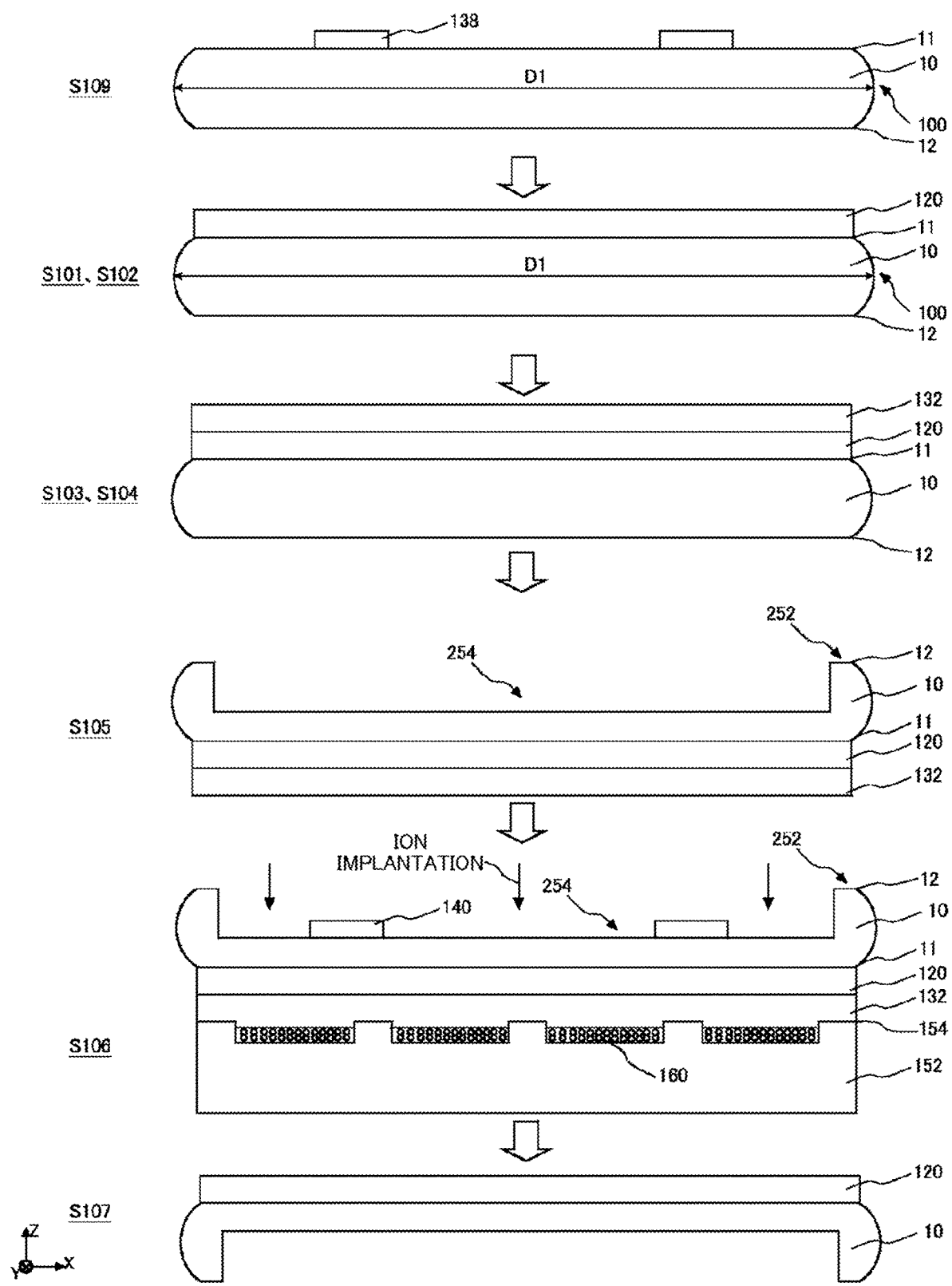
FIG. 2 is a diagram illustrating a comparative example of the manufacturing method of the semiconductor device 100.

FIG. 1 is a diagram illustrating one example of a flow chart of a manufacturing method of a semiconductor device 100 (see FIG. 2). The manufacturing method of the semiconductor device 100 includes a front surface processing step S109, a first protective film forming step S101, a first thermal curing step S102, a second protective film forming step S103, a second thermal curing step S104, a back surface grinding step S105, a back surface processing step S106 and a protective film removing step S107. Firstly, in FIG. 2, a comparative example of the manufacturing method of the semiconductor device 100 is described.

FIG. 2 is a diagram illustrating a comparative example of the manufacturing method of the semiconductor device 100. In FIG. 2, the first protective film forming step S101 is shown together with the first thermal curing step S102 and the second protective film forming step S103 is shown together with the second thermal curing step S104, respectively.

The semiconductor device 100, as one example, functions as a power conversion apparatus such as an inverter. The semiconductor device 100 may include a diode such as an insulated gate bipolar transistor (IGBT), FWD (Free Wheel Diode) and RC (Reverse Conducting)-IGBT provided by combining the two, and a MOS transistor or the like. Also, the semiconductor device 100, as one example, functions as a pressure sensor. The semiconductor device 100 may not be limited to these examples. In the present example, the semiconductor device 100 includes RC-IGBT.

The semiconductor device 100 includes a semiconductor substrate 10. The semiconductor substrate 10 in the present example is a wafer whose shape seen from the top is almost circular. The semiconductor substrate 10 is a substrate formed of a semiconductor material. As one example, the semiconductor substrate 10 is a silicon substrate, but a material of the semiconductor substrate 10 is not limited to silicon. As a diameter D1 of the semiconductor substrate 10, 200 mm±5 mm or 300 mm±5 mm is frequently used as one example. However, it is not limited to this value. A plurality of semiconductor device 100 may be manufactured by dicing the semiconductor substrate 10. Also, the semiconductor substrate 10 has a first surface 11 and a second surface 12.

The first surface 11 of the semiconductor substrate 10 may be a surface in which a gate structure of IGBT or MOS transistor or the like is formed. The gate structure is, for example, a structure including at least one of a gate metal layer, a gate insulating film, a source region, an emitter region and a channel region. The first surface 11 of the semiconductor substrate 10 may be a so-called device surface.

Before the front surface processing step S109, the first surface 11 of the semiconductor substrate 10 may be in a state in which a predetermined pattern is formed thereon. For example, before the first protective film forming step S101, the first surface 11 of the semiconductor substrate 10 is in a state in which a gate structure is formed thereon. Before the first protective film forming step S101, a step for implanting an impurity to a predetermined region of the semiconductor substrate 10, a step for annealing the semiconductor substrate 10, and a step for forming an insulating film, electrode or wiring, etc. on the first surface 11 of the semiconductor substrate 10 may be performed. Before the first protective film forming step S101, a pad region or the like may be formed on the first surface 11 of the semiconductor substrate 10. Note that, in the present example, components other than the semiconductor substrate 10 are omitted.

The second surface 12 of the semiconductor substrate 10 may be a surface on the opposite side to the first surface 11 of the semiconductor substrate 10. In the present example, the second surface 12 of the semiconductor substrate 10 is a processing surface in the back surface grinding step S105 and the back surface processing step S106.

In the front surface processing step S109, the first surface 11 of the semiconductor substrate 10 may be processed. In the present example, the electrode (not shown) provided on the first surface 11 of the semiconductor substrate 10 is patterned. Also, a resist 138 may be provided above the first surface 11 of the semiconductor substrate 10. By providing the resist 138 on the first surface 11 of the semiconductor substrate 10, the electrode provided on the first surface 11 of the semiconductor substrate 10 can be patterned. Note that, the first surface 11 of the semiconductor substrate 10 may be ion implanted and the resist 138 may be a resist used in the ion implantation. The resist 138 is an example of a first resist. An elastic modulus of the resist 138 may be the same as an elastic modulus of a resist 132 provided in the second protective film forming step S103. A photosensitive material may be included in the resist 138.

In the first protective film forming step S101, a first protective film 120 is formed. In the present example, in the first protective film forming step S101, the first protective film 120 is formed above the first surface 11 of the semiconductor substrate. The first protective film 120 may be provided above an emitter electrode 52 (see FIG. 4). The first protective film 120 may be in contact with an upper surface of the emitter electrode 52. The first protective film 120 may be provided above a pad region. By providing the first protective film 120, the first surface 11, the emitter electrode 52, and the pad region of the semiconductor substrate 10 can be protected. The first protective film 120 is, as one example, a protective film which changes into a polyimide film by thermal curing. The first protective film 120 may be a polyimide film in the first protective film forming step S101.

Figure 5:
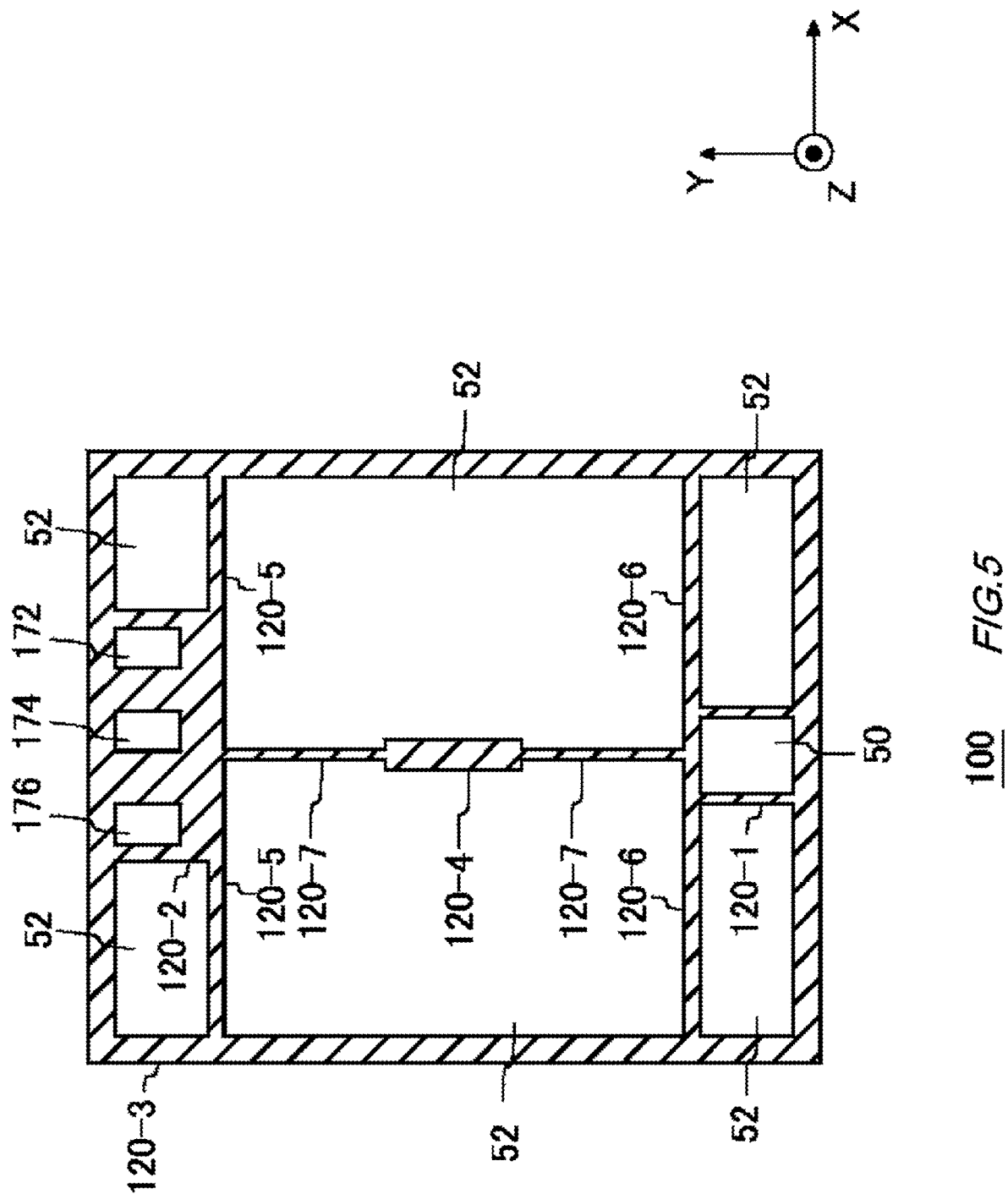
FIG. 5 is a diagram showing one example of a positioning of a first protective film 120 of the semiconductor device 100 in a top view.
Figure 6:
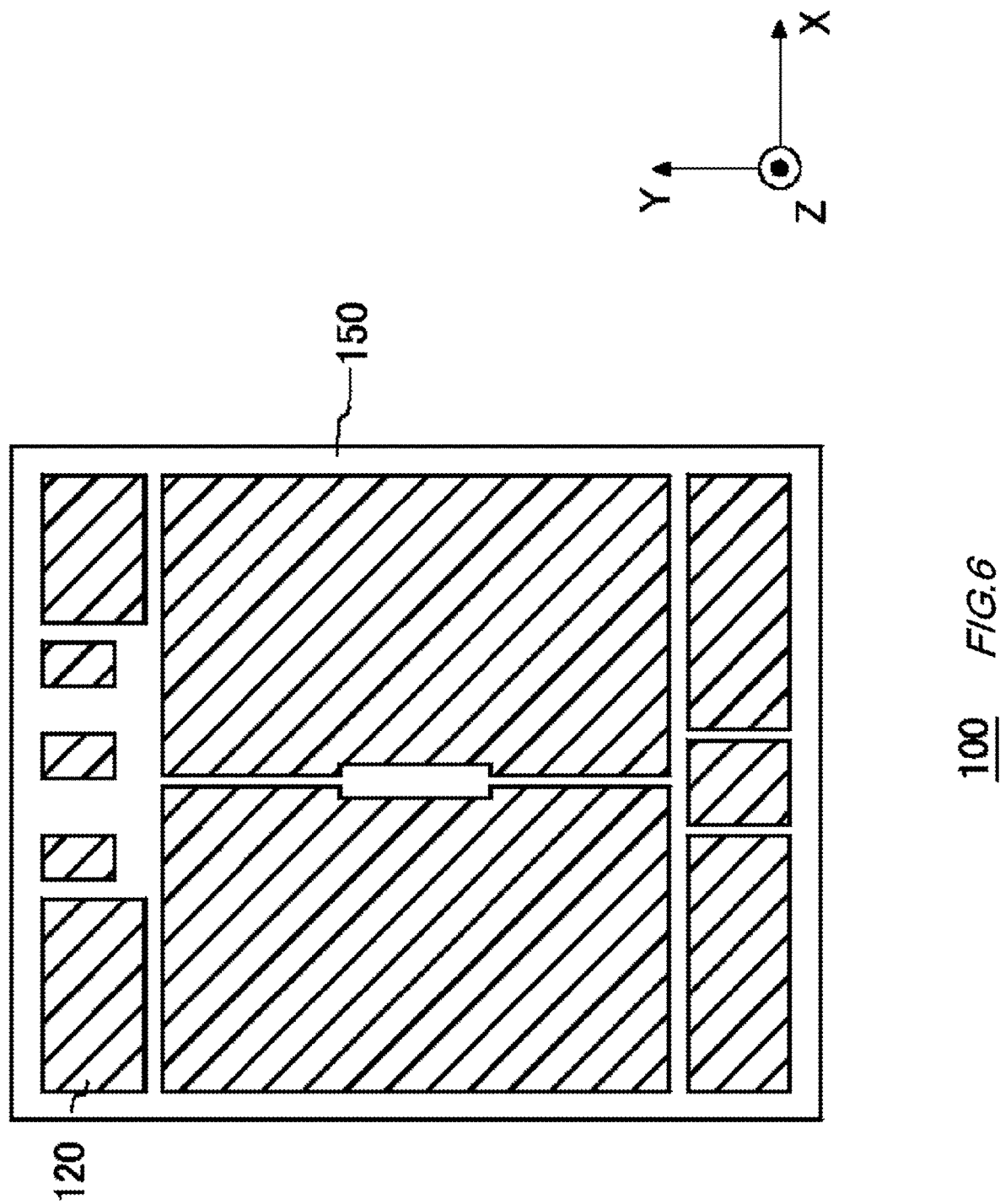
FIG. 6 is a diagram showing one example of a positioning of a resist 150 in a first protective film forming step S201.

Note that, as described in FIG. 5 and FIG. 6, a predetermined pattern may be formed on the first protective film 120. That is, in the first protective film forming step S101, the emitter electrode 52, the pad region or the like may be partially exposed. In FIG. 2, the pattern of the first protective film 120 is omitted.

In the first thermal curing step S102, the first protective film 120 may be thermally cured. The first thermal curing step S102 may be performed after the first protective film forming step S101. Also, the first thermal curing step S102 is preferred to be performed before the second protective film forming step S103. The first thermal curing step S102 may be performed by a predetermined heat treatment apparatus. The heat treatment apparatus is an annealing furnace and the like, as one example. The first protective film 120 may be thermally cured at temperature T1. The treating time is one hour, as one example. The temperature T1 is 250° C. or more and 400° C. or less, as one example. The temperature T1 is 380° C. or more, as one example. By performing the first thermal curing step S102, the first protective film can be cured, and the first surface 11 of the semiconductor substrate 10, the emitter electrode 52 and the pad region can be further protected.

In the second protective film forming step S103, a resist 132 is formed as a protective film. In the present example, in the second protective film forming step S103, the resist 132 is formed above the first protective film 120. The resist 132 may be in contact with an upper surface of the first protective film 120. By providing the resist 132, the first surface 11 of the semiconductor substrate 10 which is exposed from the first protective film 120, the emitter electrode 52 and the pad region can be also protected. The resist 132 is a resist including a photosensitive material, as one example.

In the second thermal curing step S104, the resist 132 may be thermally cured. The second thermal curing step S104 may be performed after the second protective film forming step S103. As in the first thermal curing step S102, the second thermal curing step S104 may be performed by a predetermined heat treatment apparatus. The heat treatment apparatus is an annealing furnace and the like, as one example. The resist 132 may be thermally cured at temperature T2. The treating time is 30 minutes, as one example. The temperature T2 is 100° C. or more and 200° C. or less, as one example. By performing the second thermal curing step S104, the first surface 11 of the semiconductor substrate 10, the emitter electrode 52 and the pad region can be further protected.

In the back surface grinding step S105, the second surface 12 of the semiconductor substrate 10 is ground. In FIG. 2, the shape of the semiconductor substrate 10 after grinding is shown. In the back surface grinding step S105, the semiconductor substrate 10 may be supported by a table and the like and then ground. Since the resist 132 is provided between the first surface 11 of the semiconductor substrate 10 and the table, the first surface 11 of the semiconductor substrate 10, the emitter electrode 52, and the pad region can be protected.

The back surface grinding step S105 is performed by using a grinding apparatus such as a back grinder (BG), for example. In the back surface grinding step S105, the second surface 12 of the semiconductor substrate 10 may be ground by a whetstone.

In the present example, in the back surface grinding step S105, an outer peripheral surplus region 252 is formed on an outer periphery of the semiconductor substrate 10. That is, in the back surface grinding step S105, an inside of the outer peripheral surplus region 252 is ground so that the outer peripheral surplus region 252 remains on the outer periphery of the semiconductor substrate 10. By causing the outer peripheral surplus region 252 to remain on the outer periphery, a ring-shaped reinforcement structure can remain on the semiconductor substrate 10. Accordingly, after the back surface grinding step S105, a warpage of the semiconductor substrate 10 can be suppressed. Also, in a subsequent process in the back surface grinding step S105, the semiconductor substrate 10 becomes easy to handle. A region of the semiconductor substrate 10 which is closer to the inner side than the outer peripheral surplus region 252 is referred to as a region 254.

In the back surface processing step S106, the second surface 12 of the semiconductor substrate 10 may be processed. In the present example, a region 254 is processed. In the present example, the second surface 12 of the semiconductor substrate 10 is ion implanted. In the back surface processing step S106, a P type dopant such as boron or an N type dopant such as phosphorus may be implanted to the second surface 12 of the semiconductor substrate 10. Also, a resist 140 may be provided above the second surface 12 of the semiconductor substrate 10. By providing the resist 140 on the second surface 12 of the semiconductor substrate 10, the second surface 12 of the semiconductor substrate 10 can be selectively ion implanted. The resist 140 is an example of a second resist. An elastic modulus of the resist 140 may be the same as the elastic modulus of the resist 138. The elastic modulus of the resist 140 may be the same as the elastic modulus of the resist 132. A photosensitive material may be included in the resist 140.

In the back surface processing step S106, the resist 132 may be held (chucked) on a support stand 152. In the present example, the resist 132 is in contact with an upper surface 154 of the support stand 152. By holding the resist 132 on the support stand 152, the first surface 11 of the semiconductor substrate 10, the emitter electrode 52, and the pad region do not come into contact with the upper surface 154 of the support stand 152. Accordingly, the first surface 11, the emitter electrode 52, and the pad region of the semiconductor substrate 10 can be protected. After the back surface processing step S106, the resist 132 may be removed (dechucked) from the support stand 152.

In the protective film removing step S107, the resist 132 is removed. The resist 132 may be removed by a chemical liquid. A chemical liquid used in the protective film removing step S107 may be an organic solvent. A chemical liquid used in the protective film removing step S107 includes, for example, pyrolidone. Since the resist 132 is removed by the protective film removing step S107, the resist 132 does not remain on the semiconductor device 100.

In the present example, the support stand 152 in the back surface processing step S106 has a concavo-convex on a surface holding the resist 132. That is, the support stand 152 has a concavo-convex on the upper surface 154. Since the support stand 152 has a concavo-convex on the upper surface 154, cooling gas can flow between the semiconductor substrate 10 and the support stand. Accordingly, a cooling efficiency of the semiconductor substrate 10 can be increased and an output of a beam current during the ion implantation can be increased. Accordingly, a throughput can be improved. However, if the support stand 152 having the concavo-convex on the upper surface 154 is used, as shown in FIG. 2, the resist 132 enters into the concavo-convex and thereby a problem that the semiconductor substrate 10 cannot be dechucked occurs.

Also, by the ion implantation, gas 160 is generated from the resist 132 and thereby the gas 160 is accumulated in the concavo-convex. A phenomenon in which the gas 160 is generated is referred to as degassing herein. Since the gas is accumulated in the concavo-convex by the degassing, if the semiconductor substrate 10 is dechucked after the back surface processing step S106, a problem that the semiconductor substrate 10 bounces occurs. A gas due to the degassing may be accumulated between a support stand and the semiconductor substrate 10 when the support stand without the concavo-convex is used. Also in this case, if the semiconductor substrate 10 is dechucked after the back surface processing step S106, a problem that the semiconductor substrate 10 bounces occurs. If an anti-bouncing measure which performs dechucking after providing a standby time is performed after the back surface processing step S106 in order to prevent the semiconductor substrate 10 from bouncing, the throughput decreases as a result.

Figure 3:
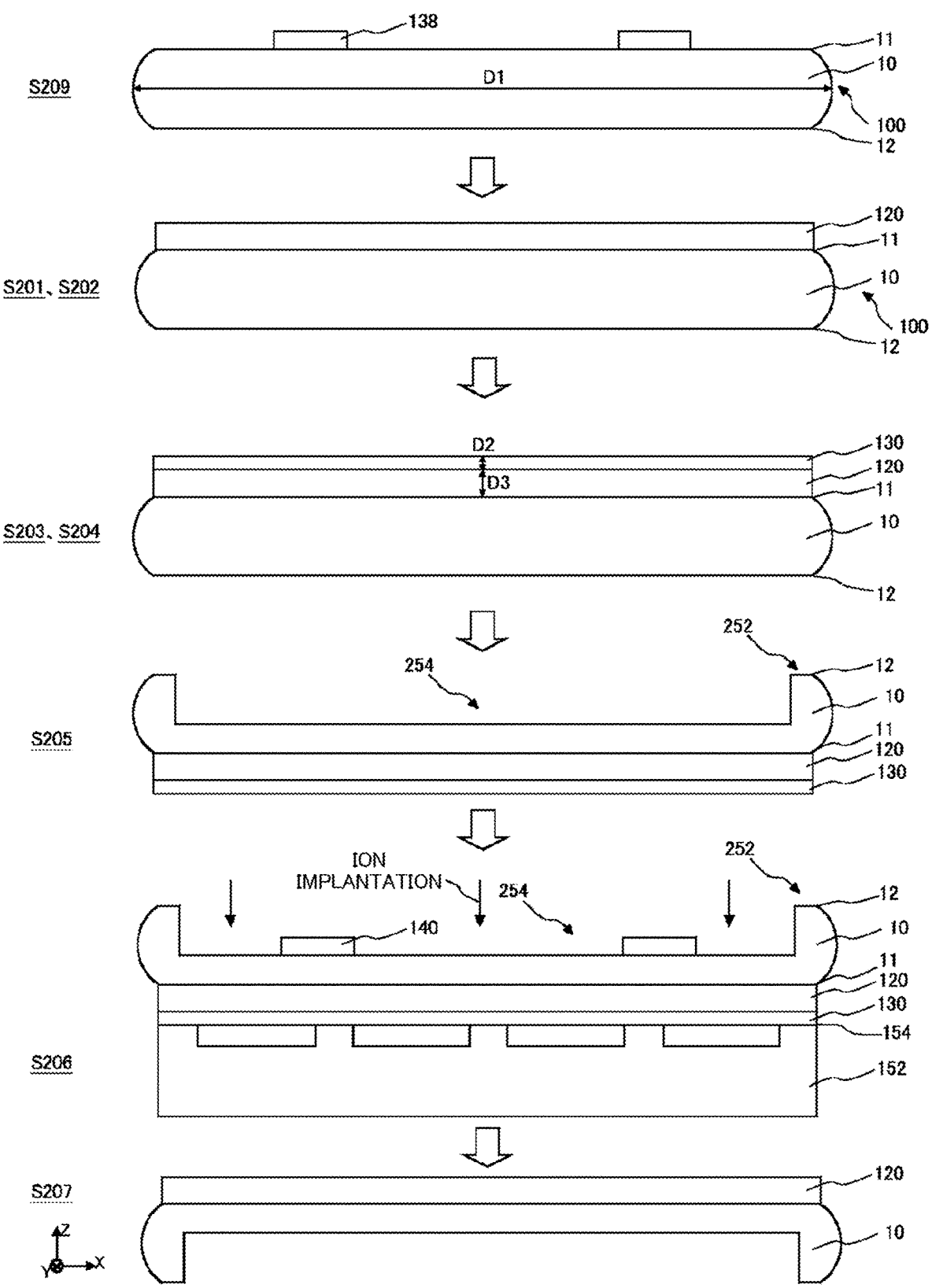
FIG. 3 is a diagram illustrating an example embodiment of the manufacturing method of the semiconductor device 100.

FIG. 3 is a diagram illustrating an example embodiment of the manufacturing method of the semiconductor device 100. In FIG. 3, the manufacturing method of the semiconductor device 100 includes a front surface processing step S209, a first protective film forming step S201, a first thermal curing step S202, a second protective film forming step S203, a second thermal curing step S204, a back surface grinding step S205, a back surface processing step S206 and a protective film removing step S207. Note that a flow chart in an example embodiment of FIG. 3 may be the same as the flow chart in FIG. 1.

The front surface processing step S209, the first protective film forming step S201, and the first thermal curing step S202 may be the same as the front surface processing step S109, the first protective film forming step S101, and the first thermal curing step S102 in FIG. 2. That is, a thermal curing temperature in the first thermal curing step S202 is the same as the thermal curing temperature in the first thermal curing step S102 in FIG. 2, namely, T1.

In the second protective film forming step S203, a second protective film 130 is formed. In the present example, in the second protective film forming step S203, the second protective film 130 is formed above the first protective film 120. The second protective film 130 may be in contact with an upper surface of the first protective film 120. By providing the second protective film 130, the first surface 11 of the semiconductor substrate 10 which is exposed from the first protective film 120, the emitter electrode 52 and the pad region can be also protected. The second protective film 130 is a polyimide film, as one example. The second protective film 130 may be a polyimide film in the second protective film forming step S203. The second protective film 130 may be a protective film which changes into a polyimide film by thermal curing. The second protective film 130 may be other than the polyimide film.

In the present example, an elastic modulus of the second protective film 130 is higher than the elastic modulus of the resist 138. The elastic modulus of the second protective film 130 may be twice or more the elastic modulus of the resist 138. Also, the elastic modulus of the second protective film 130 may be higher than the elastic modulus of the resist 132 in FIG. 2. By causing the elastic modulus of the second protective film 130 to be higher than the elastic modulus of the resist 138, the second protective film 130 becomes hard to deform. Accordingly, if the support stand 152 having the concavo-convex on the upper surface 154 is used, a problem that the second protective film 130 enters into the concavo-convex and the semiconductor substrate 10 cannot be dechucked can be resolved. Accordingly, the output of the beam current during the ion implantation can be increased, and the throughput can be improved.

Also, the elastic modulus of the second protective film 130 may be higher than the elastic modulus of the resist 140. The elastic modulus of the second protective film 130 may be twice or more the elastic modulus of the resist 140. Also, the elastic modulus of the second protective film 130 may be higher than the elastic modulus of the resist 132 in FIG. 2. By causing the elastic modulus of the second protective film 130 to be higher than the elastic modulus of the resist 140, the second protective film 130 becomes hard to deform.

Also, by using a polyimide film as the second protective film 130, the degassing occurred by the ion implantation can be suppressed. That is, in the back surface processing step S206, a degassing amount of the second protective film 130 is less than a degassing amount of the resist 132. Also, the degassing amount of the second protective film 130 may be less than a degassing amount of the resist 140. Accordingly, if the semiconductor substrate 10 is dechucked after the back surface processing step S206, the problem that the semiconductor substrate 10 bounces can be resolved. Accordingly, an anti-bouncing measure which performs dechucking after providing a standby time after the back surface processing step S206 is not required to be performed; thereby the throughput can be improved.

Also, the first protective film 120 and the second protective film 130 may be formed of different materials. When both of the first protective film 120 and the second protective film 130 are polyimide films, the materials may be different. Compositions of constituent materials of the first protective film 120 and the second protective film 130 may be different. Due to the different materials, the first protective film 120 and the second protective film 130 may have different properties. For example, the second protective film 130 has a higher dissolution rate in the protective film removing step S207 than the first protective film 120. If the dissolution rate is higher, in the protective film removing step S207, the second protective film 130 can be selectively removed. Also, the second protective film 130 may have higher swellability than the first protective film 120. If the swellability is higher, in the protective film removing step S207, since the second protective film 130 absorbs the organic solvent and swells, the second protective film 130 can be selectively removed.

For example, the first protective film 120 may not have an imide bond in the first protective film forming step S201. That is, the first protective film 120 may not be a polyimide film in the first protective film forming step S201. The first protective film 120 may have the imide bond in the first thermal curing step S202. That is, the first protective film 120 may be a polyimide film in the first thermal curing step S202. On the other hand, the second protective film 130 may have the imide bond in the second protective film forming step S203. That is, the second protective film 130 may be a polyimide film in the second protective film forming step S203. The second protective film 130 may be a pre-closed ring type.

In the second thermal curing step S204, the second protective film 130 may be thermally cured. The second thermal curing step S204 may be performed after the second protective film forming step S203. The second thermal curing step S204 may be performed by a predetermined heat treatment apparatus. The heat treatment apparatus is, as one example, an annealing furnace and the like. The second protective film 130 may be thermally cured at temperature T3. The treating time is one hour, as one example. The temperature T3 is 250° C. or more and 400° C. or less, as one example. The temperature T3 is 250° C. or more, as one example. By performing the second thermal curing step S204, the first surface 11 of the semiconductor substrate 10, the emitter electrode 52 and the pad region can be further protected.

The thermal curing temperature T3 in the second thermal curing step S204 may be lower than the thermal curing temperature T1 in the first thermal curing step S202. The thermal curing temperature T1 in the first thermal curing step S202 is 380° C., as one example. The thermal curing temperature T3 in the second thermal curing step S204 is 250° C., as one example. By causing the thermal curing temperature T3 in the second thermal curing step S204 to be lower than the thermal curing temperature T1 in the first thermal curing step S202, properties of the first protective film 120 and the second protective film 130 can be different, and the second protective film 130 can be easily removed than the first protective film 120.

After the second thermal curing step S204, a thickness D2 of the second protective film 130 may be thinner than a thickness D3 of the first protective film 120. The thickness D2 of the second protective film 130 is 5 μm or less, as one example. The thickness D3 of the first protective film 120 is 10 μm or more, as one example. By causing the thickness D2 of the second protective film 130 to be thinner than the thickness D3 of the first protective film 120, the second protective film 130 will be easily removed in the protective film removing step S207.

The back surface grinding step S205 and the back surface processing step S206 may be the same as the back surface grinding step S105 and the back surface processing step S106 in FIG. 2. In the present example, in the back surface processing step S206, the support stand 152 and the second protective film 130 are in contact with each other, the second protective film 130 does not enter into the concavo-convex of the upper surface 154. Also, in the present example, in the back surface processing step S206, the gas 160 is not accumulated in the concavo-convex of the upper surface 154.

In the protective film removing step S207, the second protective film 130 is removed. In the protective film removing step S207, the second protective film 130 may be selectively removed. The second protective film 130 may be removed by a chemical liquid. A chemical liquid used in the protective film removing step S207 may be an organic solvent.

The organic solvent may have a higher removability for the second protective film 130 than for the first protective film 120. By using such organic solvent, the second protective film 130 can be selectively removed. The organic solvent may include alkanolamine. The organic solvent includes ethanolamine, for example. The organic solvent includes isopropanolamine, for example. The organic solvent may be a mixture of glycol ether and alkanolamine.

Figure 4:
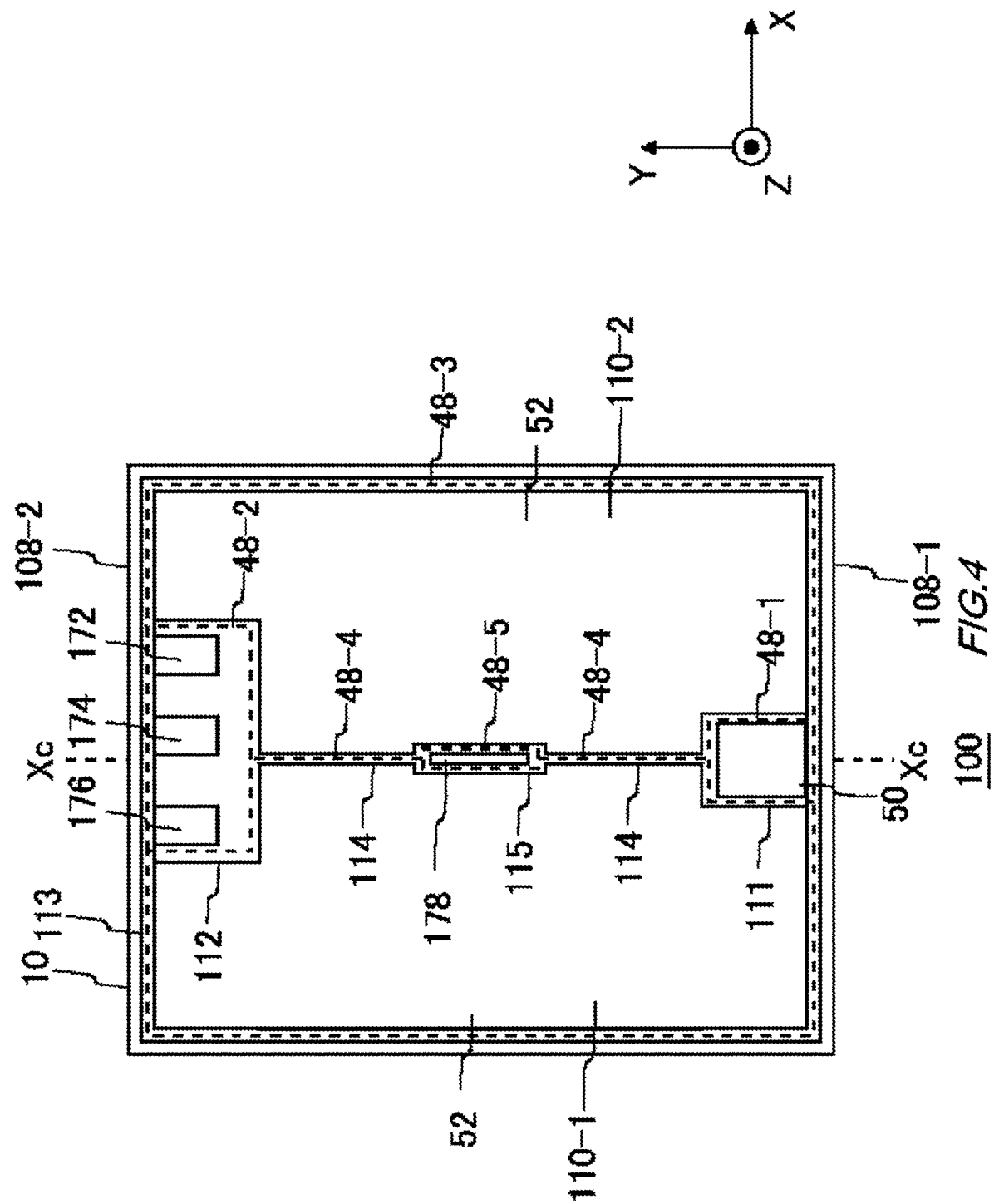
FIG. 4 is a diagram showing one example of a positioning of a gate runner 48, a well region and a pad region of the semiconductor device 100 in a top view.

FIG. 4 is a diagram showing one example of a positioning of a gate runner 48, a well region and a pad region of the semiconductor device 100 in a top view. The semiconductor substrate 10 has an end side 108 in a top view. The semiconductor substrate 10 of the present example has two sets of end sides 108 facing each other in a top view. In FIG. 4, a set of end sides 108-1 and 108-2 facing each other is shown. In FIG. 4, a direction parallel to the end side 108-1 and the end side 108-2 is referred to as an X axis direction, and a direction perpendicular to the end side 108-1 and the end side 108-2 is referred to as a Y axis direction.

The semiconductor substrate 10 is provided with an active portion 110. In the present example, the semiconductor substrate 10 is provided with an active portion 110-1 and an active portion 110-2. The active portion 110 is a region where a main current flows in the depth direction between the upper surface and the lower surface of the semiconductor substrate 10 in a case where the semiconductor device 100 is controlled to be in an ON state. Accordingly, a region inside a well region in FIG. 4 may be referred to as the active portion 110. The active portion 110 may be provided with a transistor portion including a transistor device such as IGBT. The active portion 110 may be provided with a diode portion including a diode device such as FWD. The active portion 110 may be a region in which at least one of the transistor portion and the diode portion is provided. As described in FIG. 8, in the present example, the active portion 110 is provided with the transistor portion and the diode portion. The active portion 110 may be a region which overlaps with an upper surface main electrode in a top view. The upper surface main electrode may be an electrode which occupies a maximum area in a top view among electrodes positioned above the upper surface of the semiconductor substrate 10. The upper surface main electrode may be electrically connected to an emitter region or a source region of the transistor portion, or may be electrically connected to an anode region of the diode portion, for example. In the example of FIG. 4, the emitter electrode 52 is the upper surface main electrode.

The semiconductor substrate 10 is provided with a P type well region. The well region is a P type region having a higher concentration than a base region of the transistor portion or the anode region of the diode portion. The base region is a P type region which is positioned opposite to a gate metal layer, and which has a channel formed on a portion opposite to the gate metal layer when a predetermined gate voltage is applied to the gate metal layer. The semiconductor device 100 has a first well region 111 and a second well region 112. The first well region 111 and the second well region 112 are positioned to sandwich the active portion 110 in a top view. The first well region 111 and the second well region 112 are positioned to sandwich the active portion 110 in a predetermined direction (in FIG. 4, Y axis direction). To sandwich the active portion 110 by the two well regions refers to that any straight line connecting the two well regions in a top view passes through the active portion 110.

The first well region 111 may be positioned in vicinity of the end side 108-1. That is, a distance between the first well region 111 and the end side 108-1 is smaller than a distance between the first well region 111 and the end side 108-2. The second well region 112 may be positioned in vicinity of the end side 108-2. That is, a distance between the second well region 112 and the end side 108-2 is smaller than a distance between the second well region 112 and the end side 108-1.

The first well region 111 of the present example is positioned in the Y axis direction between the active portion 110 and the end side 108-1. The active portion 110 is not provided between the first well region 111 and the end side 108-1. That is, the first well region 111 is positioned between the end portion of the active portion 110 in the Y axis direction and the end side 108-1.

The second well region 112 of the present example is positioned in the Y axis direction between the active portion 110 and the end side 108-2. The active portion 110 is not provided between the second well region 112 and the end side 108-2. That is, the second well region 112 is positioned between the end portion of the active portion 110 in the Y axis direction and the end side 108-2.

The first well region 111 and the second well region 112 may be provided, in the X axis direction, in a range including a center position Xc of the end side 108-1 and the end side 108-2. The first well region 111 may be sandwiched between the active portions 110 in the X axis direction. The second well region 112 may be sandwiched between the active portions 110 in the X axis direction. The second well region 112 may be provided in a wider range in the X axis direction than the first well region 111.

The semiconductor device 100 may have a peripheral well region 113 positioned to surround the active portion 110 in a top view. The peripheral well region 113 may be provided parallel to respective end sides of the semiconductor substrate 10. The peripheral well region 113 of the present example is an annular region surrounding the active portion 110 in a top view. The peripheral well region 113 may have a constant width in a direction perpendicular to the respective end sides.

The first well region 111 and the second well region 112 of the present example protrude closer to a central side of the active portion 110 than the peripheral well region 113. In another example, at least one of the first well region 111 and the second well region 112 may be positioned between the peripheral well region 113 and the end side 108 of the semiconductor substrate 10. In this case, the first well region 111 and the second well region 112 protrude from the peripheral well region 113 to the end side 108 side.

The semiconductor device 100 may have a dividing well region 114 for dividing the active portion 110 in a top view. Because of a well region including the dividing well region 114, the active portion 110 may be divided into the active portion 110-1 and the active portion 110-2. The dividing well region 114 has a longitudinal part in a predetermined well longitudinal direction. The dividing well region 114 extends in the well longitudinal direction to traverse the active portion 110. The well longitudinal direction of the dividing well region 114 is the Y axis direction.

The dividing well region 114 may be provided between the first well region 111 and the second well region 112. One end in the longitudinal direction of the dividing well region 114 may be connected to the first well region 111, and the other end may be connected to the second well region 112. The dividing well region 114 may be provided in a region which overlaps with a center of the active portion 110.

The dividing well region 114 may include a wide portion 115 whose width in a direction perpendicular to the well longitudinal direction in a top view (in the present example, X axis direction) is wider than those of the other portions. The wide portion 115 is also provided between the first well region 111 and the second well region 112. The wide portion 115 may be provided in a region which overlaps with a center of the active portion 110. The wide portion 115 may be positioned in a region including a center in the well longitudinal direction of the dividing well region 114.

The semiconductor device 100 of the present example has a control electrode such as a gate pad 50, a current detection pad 172, an anode pad 174, and a cathode pad 176. Each of the gate pad 50, the current detection pad 172, the anode pad 174, and the cathode pad 176 is one example of the pad region.

A temperature sensing unit 178 is a PN junction diode formed of a semiconductor material such as polysilicon. The temperature sensing unit 178 is positioned above the wide portion 115. That is, at least part of the temperature sensing unit 178 and at least part of the wide portion 115 are overlapped. A region occupying half or more of the temperature sensing unit 178 of the present example in a top view is overlapped with the wide portion 115. The temperature sensing unit 178 may overlap with the wide portion 115 as a whole.

The emitter electrode 52 and respective control electrodes are electrodes including metal such as aluminum. An insulating film is provided between the emitter electrode 52 and respective control electrodes, and the semiconductor substrate 10. The emitter electrode 52 and the respective control electrodes are connected to the semiconductor substrate 10 via a contact hole provided on the insulating film. In FIG. 4, the insulating film and the contact hole are omitted.

The emitter electrode 52 is positioned above the active portion 110. The emitter electrode 52 is connected to the active portion 110 via the contact hole described above. A wiring member is connected to the upper surface of the emitter electrode 52, and a predetermined emitter voltage is applied thereto. The emitter electrode 52 and the respective control electrodes are provided separately from each other in a top view. A wire or the like is connected to an upper surface of the respective control electrodes. The emitter electrode 52 may be provided for each of the active portion 110-1 and the active portion 110-2.

A predetermined gate voltage is applied to the gate pad 50. The gate voltage applied to the gate pad 50 is supplied to the transistor portion of the active portion 110 by a gate runner or the like described below. The gate pad 50 is positioned above the first well region 111. That is, at least part of the gate pad 50 and at least part of the first well region 111 are overlapped. A region occupying half or more of the gate pad 50 of the present example in a top view is overlapped with the first well region 111. The gate pad 50 may overlap with the first well region 111 as a whole. The gate pad 50 of the present example may be positioned in vicinity of the end side 108-1 of the semiconductor device 100. That is, the gate pad 50 is positioned between the emitter electrode 52 and the end side 108-1 of the semiconductor device 100, and the emitter electrode 52 is not positioned between the gate pad 50 and the end side 108-1. Furthermore, the gate pad 50 may be positioned in a region including the center position Xc in the X axis direction of the end side 108-1 of the semiconductor device 100.

The current detection pad 172 is connected to a current detection unit (not shown) and detects a current flowing in the current detection unit. The anode pad 174 is connected to an anode region of the temperature sensing unit 178 via a wiring. The cathode pad 176 is connected to a cathode region of the temperature sensing unit 178 via a wiring. The current detection pad 172, the anode pad 174, and the cathode pad 176 are positioned above the second well region 112. For the respective control electrodes of the current detection pad 172, the anode pad 174, and the cathode pad 176, at least part of the control electrode overlaps with at least part of the second well region 112. Regions occupying half or more of the current detection pad 172, the anode pad 174, and the cathode pad 176 of the present example in a top view overlap with the second well region 112. The current detection pad 172, the anode pad 174, and the cathode pad 176 may overlap with the second well region 112 as a whole. The respective control electrodes of the current detection pad 172, the anode pad 174, and the cathode pad 176 of the present example may be positioned in vicinity of the end side 108-2 of the semiconductor device 100. That is, the respective control electrodes of the current detection pad 172, the anode pad 174, and the cathode pad 176 is positioned between the emitter electrode 52 and the end side 108-2 of the semiconductor device 100, but the emitter electrode 52 is not positioned between the respective control electrodes and the end side 108-2. Furthermore, the respective control electrodes may be positioned in a region including the center position Xc in the X axis direction of the end side 108-2 of the semiconductor device 100. In the present example, the gate pad 50, as well as the respective control electrodes of the current detection pad 172, the anode pad 174, and the cathode pad 176 may be respectively positioned in the end side 108-1 and 108-2 of the semiconductor device 100 which are facing each other. Furthermore, they may be positioned to face each other via the dividing well region 114.

In FIG. 4, the gate runner 48 is shown in a dashed line. The gate runner 48 is a wiring formed of a conductive material such as polysilicon with impurity added thereto, or metal. The gate runner 48 supplies a gate voltage applied to the gate pad 50 to the transistor portion provided on the active portion 110. The gate runner 48 may be positioned above the well region.

The semiconductor device 100 may have a gate runner 48-3 positioned to surround the active portion 110 in a top view. The gate runner 48-3 may be positioned above the peripheral well region 113.

The semiconductor device 100 may include a gate runner 48-1 which surrounds at least a partial region of the first well region 111 in a top view. The gate runner 48-1 may be positioned along end sides of the first well region 111 in a top view. The gate runner 48-1 may include portions parallel to the respective end sides of the first well region 111.

The semiconductor device 100 may include a gate runner 48-2 which surrounds at least a partial region of the second well region 112 in a top view. The gate runner 48-2 may be positioned along an end side of the second well region 112 in a top view. The gate runner 48-2 may include portions parallel to the respective end sides of the second well region 112.

The semiconductor device 100 may have a gate runner 48-4 positioned above the dividing well region 114 in a top view. The semiconductor device 100 may include a gate runner 48-5 which surrounds at least a partial region of the wide portion 115 in a top view. The gate runner 48-5 may be positioned along an end side of the wide portion 115 in a top view. The gate runner 48-5 may have portions parallel to the respective end sides of the wide portion 115. The gate runner 48-4 and the gate runner 48-5 may divide the active portion 110 in a top view.

The semiconductor device 100 may include an edge termination structure portion between the peripheral well region 113 and the end side of the semiconductor substrate 10. The edge termination structure portion reduces an electric field strength on the upper surface side of the semiconductor substrate 10. The edge termination structure portion has, for example, a guard ring provided in an annular shape surrounding the active portion 110, a field plate, RESURF and a combined structure thereof.

FIG. 5 is a diagram showing one example of a positioning of a first protective film 120 of the semiconductor device 100 in a top view. In FIG. 5, a region with the first protective film 120 positioned thereon is shown by hatching of diagonal lines.

The semiconductor device 100 may have a first protective film 120-1 which covers the first well region 111. The first protective film 120-1 may expose a part of an upper surface of the gate pad 50. In this way, a wire or the like can be connected to the upper surface of the gate pad 50.

The semiconductor device 100 may have a first protective film 120-2 which covers the second well region 112. The first protective film 120-2 may partially expose the upper surfaces of the current detection pad 172, the anode pad 174, and the cathode pad 176. In this way, a wire or the like can be connected to the upper surfaces of the current detection pad 172, the anode pad 174, and the cathode pad 176.

The semiconductor device 100 may have a first protective film 120-3 which covers the peripheral well region 113. The first protective film 120-3 may cover the entire peripheral well region 113. The semiconductor device 100 may have a first protective film 120-4 and a first protective film 120-7 which cover the dividing well region 114. The entire dividing well region 114 may be covered by the first protective film 120-4 and the first protective film 120-7. In the present example, the first protective film 120-4 covers the entire wide portion 115, and the first protective film 120-7 covers the entire dividing well region 114 other than the wide portion 115.

The first protective film 120 exposes a part of the upper surface of the emitter electrode 52. In this way, a wire or the like can be easily connected to the upper surface of the emitter electrode 52.

The semiconductor device 100 may have a first protective film 120-5 and a first protective film 120-6 which divide the upper surface of the semiconductor substrate 10. The first protective film 120-5 and the first protective film 120-6 may be provided to traverse the upper surface of the semiconductor substrate 10 in the X axis direction.

In summary, above the semiconductor substrate 10, not all of the semiconductor substrate 10 is provided with the first protective film 120. That is, a predetermined pattern is formed on the first protective film 120. The first protective film 120 exposes a part of the upper surface of the emitter electrode 52, and a part of the pads or the like.

FIG. 6 is a diagram showing one example of a positioning of a resist 150 in a first protective film forming step S201. The resist 150 is a resist used in patterning the first protective film 120 in the first protective film forming step S201. The resist 150 is an example of a third resist. In the present example, the resist 150 covers the first protective film 120-1, the first protective film 120-2, the first protective film 120-3, the first protective film 120-4, the first protective film 120-5, the first protective film 120-6, and the first protective film 120-7 in FIG. 5. Accordingly, the predetermined pattern as shown in FIG. 5 can be formed on the first protective film 120. Also, the first protective film 120 which is not covered by the resist 150 is removed. A photosensitive material may be included in the resist 150.

The elastic modulus of the second protective film 130 may be higher than the elastic modulus of the resist 150. The elastic modulus of the second protective film 130 may be twice or more the elastic modulus of the resist 150. By causing the elastic modulus of the second protective film 130 to be higher than the elastic modulus of the resist 150, the second protective film 130 becomes hard to deform. Accordingly, if the support stand 152 having the concavo-convex on the upper surface 154 is used, a problem that the second protective film 130 enters into the concavo-convex and the semiconductor substrate 10 cannot be dechucked can be resolved.

FIG. 7 is a diagram showing one example of a positioning of a second protective film 130 in a second protective film forming step S203. Above the semiconductor substrate 10, the second protective film 130 may be provided on the entire semiconductor substrate 10. That is, the predetermined pattern is not formed on the second protective film 130.

Comparing FIG. 5 and FIG. 7, the second protective film 130 may be provided in a wider range than the first protective film 120 in a top view. Since the second protective film 130 is provided on the entire semiconductor substrate 10, the first surface 11, the emitter electrode 52, and the pad region of the semiconductor substrate 10 can also be protected.

Figure 8:
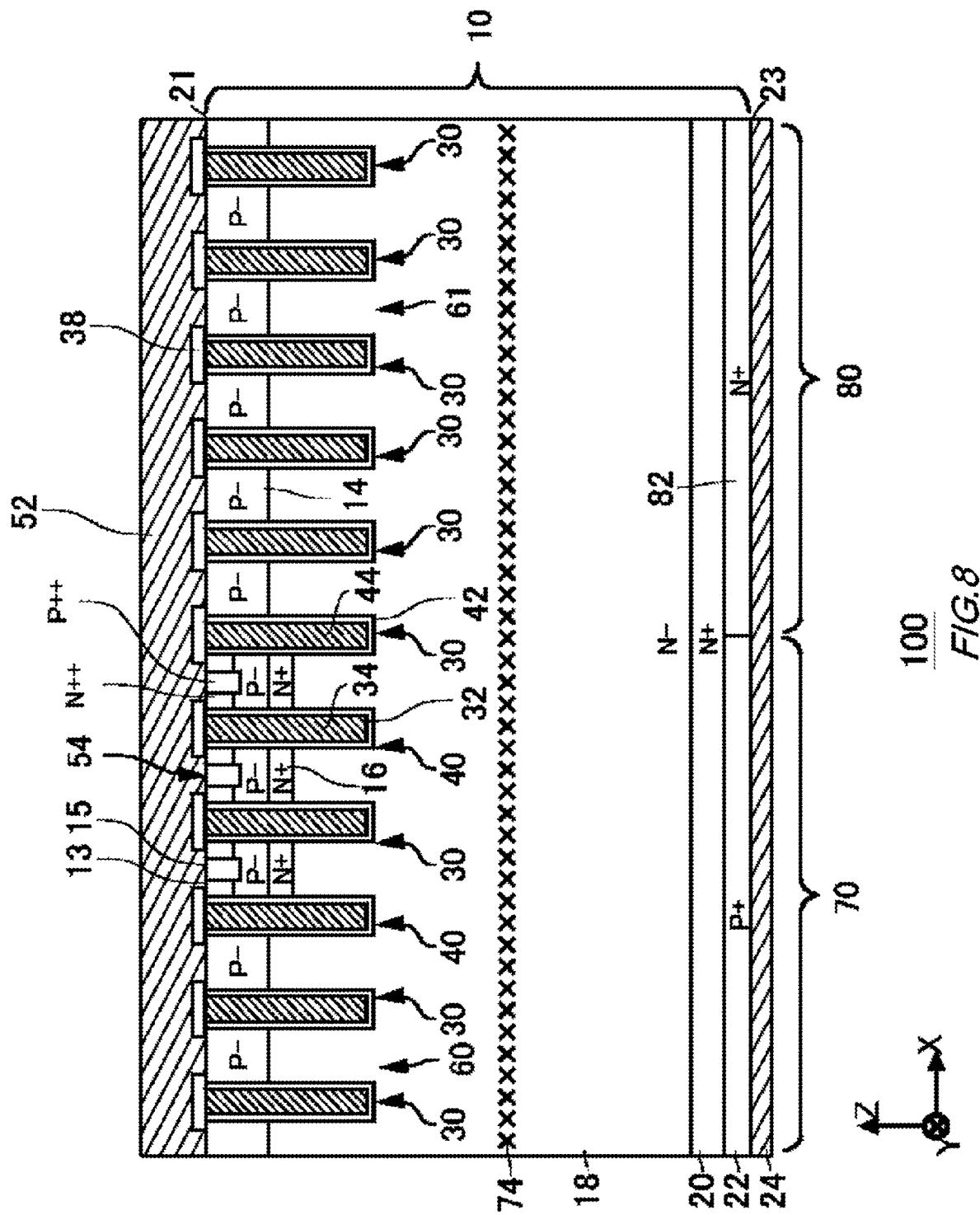
FIG. 8 is a diagram showing one example of a cross-sectional view of the semiconductor device 100 in an active portion 110.

FIG. 8 is a diagram showing one example of a cross-sectional view of the semiconductor device 100 in an active portion 110. This cross-section is an X-Z plane which passes through an emitter region 13 and a cathode region 82. The semiconductor device 100 of the present example includes the semiconductor substrate 10, an interlayer dielectric film 38, the emitter electrode 52, and a collector electrode 24 in the cross-section.

A transistor portion 70 includes a P+ type collector region 22 in a region in contact with the lower surface of the semiconductor substrate 10. Also, the transistor portion 70 has gate structures periodically positioned on the upper surface side of the semiconductor substrate 10, the gate structures having an N type emitter region 13, a P type base region 14, a contact region 15, a gate conductive portion, and a gate insulating film.

A diode portion 80 includes an N+ type cathode region 82 in a region in contact with the lower surface of the semiconductor substrate 10. In the present specification, a region where the cathode region is provided is referred to as a diode portion 80. That is, the diode portion 80 is a region that overlaps with the cathode region in a top view. In the lower surface of the semiconductor substrate 10, a P+ type collector region may be provided in a region other than the cathode region.

The interlayer dielectric film 38 is provided on the upper surface of the semiconductor substrate 10. The interlayer dielectric film 38 is a film including at least one layer of an insulating film such as silicate glass to which an impurity such as boron or phosphorus is added, a thermal oxide film, and other insulating films. The interlayer dielectric film 38 is provided with a contact hole 54.

The emitter electrode 52 is provided above the interlayer dielectric film 38. The emitter electrode 52 is in contact with the upper surface 21 of the semiconductor substrate 10 through the contact hole 54 of the interlayer dielectric film 38. The collector electrode 24 is provided on the lower surface 23 of the semiconductor substrate 10. The collector electrode 24 is formed of a metal material such as aluminum.

Each of the transistor portion 70 and the diode portion 80 has a plurality of trench portion arranged in an arrangement direction (In the present example, X axis direction). In the transistor portion 70 of the present example, one or more gate trench portions 40 and one or more dummy trench portions 30 are periodically provided along the arrangement direction. In the diode portion 80 of the present example, the plurality of dummy trench portions 30 are provided along the arrangement direction. In the diode portion 80 of the present example, the gate trench portion 40 is not provided.

A mesa portion is provided between the trench portions in the arrangement direction. The mesa portion refers to a region sandwiched between the trench portions inside the semiconductor substrate 10. As one example, the upper end of the mesa portion is the upper surface of the semiconductor substrate 10. The depth position of the lower end of the mesa portion is the same as the depth position of the lower end of the trench portion. The mesa portion of the present example is provided to extend in the extending direction (Y axis direction) along the trench in the upper surface of the semiconductor substrate 10. In the present example, a mesa portion 60 is provided in the transistor portion 70, and a mesa portion 61 is provided in the diode portion 80. In the case of simply mentioning "mesa portion" in the present specification, the mesa portion refers to each of the mesa portion 60 and the mesa portion 61.

Each mesa portion is provided with the base region 14. The mesa portion 60 of the transistor portion 70 includes the emitter region 13 exposed on the upper surface 21 of the semiconductor substrate 10. The emitter region 13 is provided in contact with the gate trench portion 40. Also, the mesa portion 60 in contact with the gate trench portion 40 may be provided with the contact region 15 exposed on the upper surface 21 of the semiconductor substrate 10.

As one example, the contact region and the emitter region 13 of the mesa portion 60 are provided in a stripe-like shape along the extending direction (Y axis direction) of the trench portion. That is, the emitter regions 13 are provided in a region in contact with the trench portion, and the contact region 15 is provided in a region sandwiched by the emitter regions 13.

In another example, the contact region 15 and the emitter region 13 of the mesa portion 60 are each provided from one trench portion to the other trench portion in the X axis direction. In this case, the contact region 15 and the emitter region 13 of the mesa portion 60 may be positioned alternately along the extending direction (Y axis direction) of the trench portion.

The emitter region 13 is not provided in the mesa portion 61 of the diode portion 80. The base region 14 and the contact region 15 may be provided on the upper surface of the mesa portion 61.

An accumulation region 16 is provided below the base region 14. The accumulation region 16 is an N+ type region having a higher doping concentration than a drift region 18. By providing the high concentration accumulation region 16 between the drift region 18 and the base region 14, a carrier injection enhancement effect (IE effect) can be enhanced, and an ON voltage can be reduced. The accumulation region 16 may be provided to cover the entire lower surface of the base region 14 on each of the mesa portions 60. The accumulation region 16 may be provided on the transistor portion 70 only.

On each of the transistor portion 70 and the diode portion 80, an N+ type buffer region 20 is provided on a side closer to the lower surface 23 than the drift region 18. The buffer region 20 may function as a field stop layer which prevents a depletion layer expanding from the lower end of the base region 14 from reaching the P+ type collector region 22 and the N+ type cathode region 82.

In the transistor portion 70, the P+ type collector region 22 is provided below the buffer region 20. The acceptor concentration of the collector region 22 is higher than the acceptor concentration of the base region 14. The collector region 22 may include the same acceptor as the base region 14, and may include a different acceptor. The acceptor of the collector region 22 is, for example, boron.

In the diode portion 80, the N+ type cathode region 82 is provided below the buffer region 20. The donor of the cathode region 82 is, for example, hydrogen or phosphorus. Note that an element serving as a donor and an acceptor in each region is not limited to the examples described above.

One or more gate trench portions 40 and one or more dummy trench portions 30 are provided on the upper surface 21 side of the semiconductor substrate 10. Each trench portion penetrates the base region 14 from the upper surface 21 of the semiconductor substrate 10 to reach the drift region 18. The trench portion penetrating the doping region is not limited to those manufactured in the order of forming the doping region and then forming the trench portion. A configuration of the trench portion penetrating the doping region also includes a configuration of the doping region being formed between the trench portions after forming the trench portion.

The gate trench portion 40 includes a gate trench, a gate insulating film 42, and a gate conductive portion 44 provided on the upper surface 21 of the semiconductor substrate 10. The gate insulating film 42 is provided to cover the inner wall of the gate trench. The gate insulating film 42 may be formed by oxidizing or nitriding the semiconductor in the inner wall of the gate trench. The gate conductive portion 44 is provided closer to the inner side than the gate insulating film 42 inside the gate trench. That is, the gate insulating film 42 insulates the gate conductive portion 44 from the semiconductor substrate 10. The gate conductive portion 44 is formed of a conductive material such as polysilicon.

The gate conductive portion 44 may be provided longer than the base region 14 in the depth direction. The gate trench portion 40 in the cross-section is covered with the interlayer dielectric film 38 in the upper surface 21 of the semiconductor substrate 10. The gate conductive portion 44 is electrically connected to the gate runner 48. The gate conductive portion 44 may be connected to the gate pad 50. When a predetermined gate voltage is applied to the gate conductive portion 44, a channel is formed by an electron inversion layer in a surface layer of an interface the base region 14, which is in contact with the gate trench portion 40.

The dummy trench portion 30 may have the same structure as the gate trench portion 40 in the cross-section. The dummy trench portion 30 includes a dummy trench provided in the upper surface 21, a dummy insulating film 32, and a dummy conductive portion 34 of the semiconductor substrate 10. The dummy conductive portion 34 may be connected to an electrode different from the gate pad 50. For example, the dummy conductive portion 34 may be connected to a dummy pad (not illustrated) connected to an external circuit different from the gate pad 50, and a control different from that of the gate conductive portion 44 may be performed. Also, the dummy conductive portion 34 may be electrically connected to the emitter electrode 52. The dummy insulating film 32 is provided to cover the inner wall of the dummy trench. The dummy conductive portion 34 is provided inside the dummy trench and is provided closer to the inner side than the dummy insulating film 32. The dummy insulating film 32 insulates the dummy conductive portion 34 from the semiconductor substrate 10. The dummy conductive portion 34 may be formed of the same material as the gate conductive portion 44. For example, the dummy conductive portion 34 is formed of a conductive material such as polysilicon. The dummy conductive portion 34 may have the same length as the gate conductive portion 44 in the depth direction.

The gate trench portion 40 and the dummy trench portion 30 of the present example are covered with the interlayer dielectric film 38 in the upper surface 21 of the semiconductor substrate 10. Note that the bottom portions of the dummy trench portion 30 and the gate trench portion 40 may have a curved surface shape protruding downward (a curved shape in the cross-section).

A lifetime control unit 74 is a region where a lifetime killer is intentionally formed by, for example, implanting impurities into the semiconductor substrate. The lifetime killer is a carrier recombination center, which may be a crystal defect, a vacancy or a divacancy, may be a defect complex which is formed due to the above-mentioned defects and elements configuring the semiconductor substrate 10, and may be a dislocation, a noble gas element such as helium and neon, a metal element such as platinum and the like. The lifetime control unit 74 can be formed by implanting helium or the like into semiconductor substrate 10.

Figure 9:
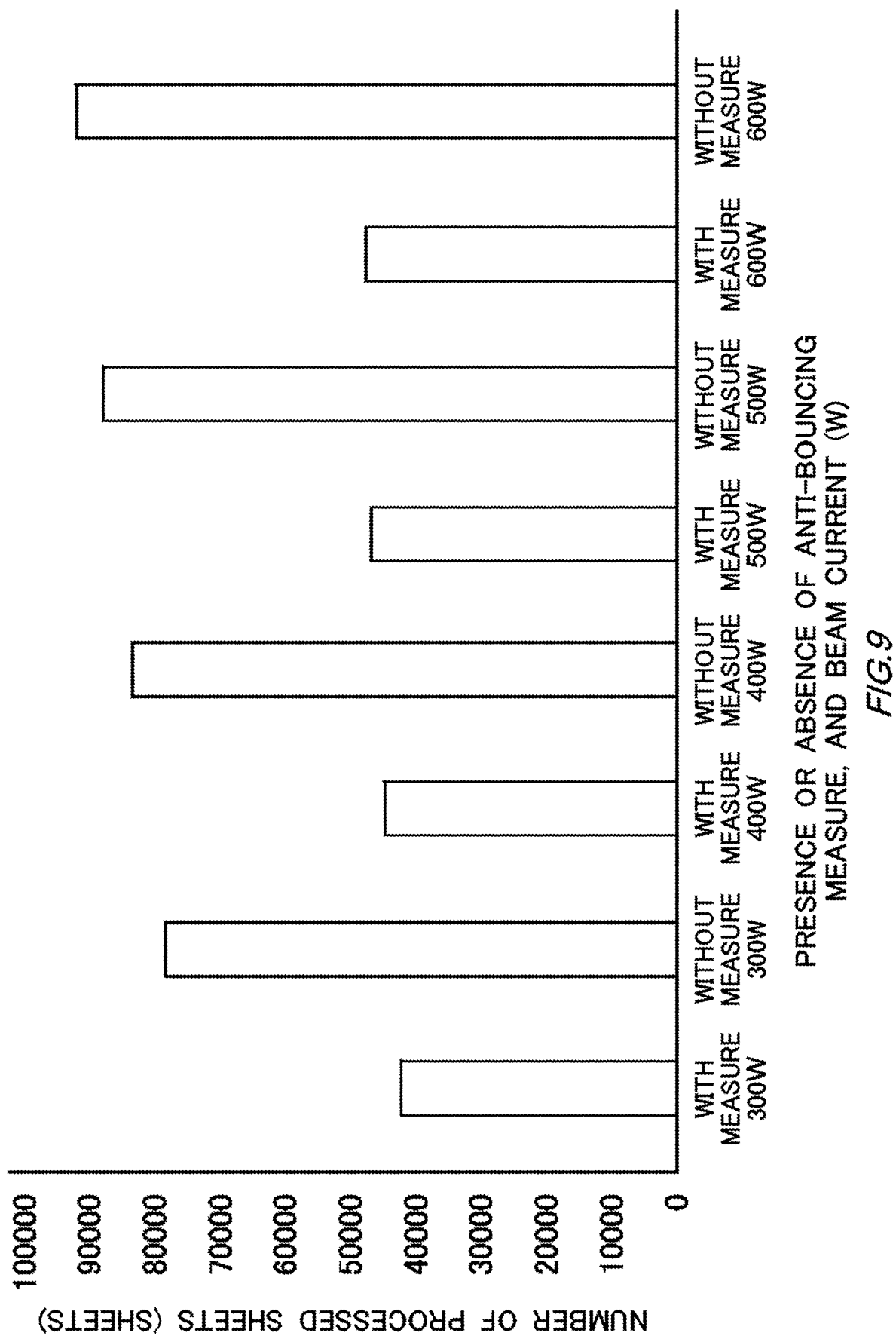
FIG. 9 is a diagram showing a relationship between the presence or absence of an anti-bouncing measure and beam current and the number of processed sheets.

FIG. 9 is a diagram showing the presence or absence of an anti-bouncing measure, and a relationship between beam current and the number of processed sheets. The anti-bouncing measure is to perform dechucking after providing a standby time after the back surface processing step S206. The beam current is an output of the beam current during the ion implantation.

In FIG. 9, if the beam currents are the same, the number of processed sheets is greater in a case without the anti-bouncing measure compared to a case with the anti-bouncing measure. It is because the case with the anti-bouncing measure is provided with the standby time for dechucking and therefore requires more time for processing. In the present embodiment, since the degassing amount of the second protective film 130 is less than the degassing amount of the resist 140, it is possible to improve the throughput without being required to perform the measure to perform the dechucking after providing the standby time after the back surface processing step S206.

Also, by increasing the output of the beam current during the ion implantation, the number of processed sheets can be increased. Since the support stand 152 of the present embodiment has the concavo-convex on the upper surface 154, a cooling gas can flow between the semiconductor substrate 10 and the support stand, thus the output of the beam current during the ion implantation can be increased.

While the embodiments of the present invention have been described, the technical scope of the present invention is not limited to the above-described embodiments. It is apparent to persons skilled in the art that various alterations and improvements can be added to the above-described embodiments. It is also apparent from the scope of the claims that the embodiments added with such alterations or improvements can be included in the technical scope of the present invention.

What is claimed is:

1. A manufacturing method of a semiconductor device comprising a semiconductor substrate which includes a first surface and a second surface which is on an opposite side of the first surface, the method comprising:
   a front surface processing for providing a first resist to the first surface of the semiconductor substrate and processing the first surface;
   a first protective film forming for forming a first protective film above the first surface of the semiconductor substrate;
   a second protective film forming for forming a second protective film above the first protective film, wherein a material of the second protective film is different from that of the first protective film;
   a back surface processing for holding the second protective film on a support stand and processing the second surface of the semiconductor substrate; and
   a protective film removing for selectively removing the second protective film by an organic solvent which has a higher removability for the second protective film than the first protective film; wherein
   an elastic modulus of the second protective film is higher than an elastic modulus of the first resist, and
   the second protective film has a higher dissolution rate than the first protective film.

2. The manufacturing method of the semiconductor device according to claim 1, wherein the support stand has a concavo-convex on a surface holding the second protective film.

3. The manufacturing method of the semiconductor device according to claim 1, wherein the second protective film is a polyimide film.

4. The manufacturing method of the semiconductor device according to claim 1, wherein the organic solvent includes alkanolamine.

5. The manufacturing method of the semiconductor device according to claim 4, wherein the organic solvent is a mixture of glycol ether and alkanolamine.

6. A manufacturing method of a semiconductor device comprising a semiconductor substrate which includes a first surface and a second surface which is on an opposite side of the first surface, the method comprising
   a front surface processing for providing a first resist to the first surface of the semiconductor substrate and processing the first surface;
   a first protective film forming for forming a first protective film above the first surface of the semiconductor substrate;
   a second protective film forming for forming a second protective film above the first protective film, wherein a material of the second protective film is different from that of the first protective film;
   a back surface processing for holding the second protective film on a support stand and processing the second surface of the semiconductor substrate;
   a protective film removing for selectively removing the second protective film by an organic solvent which has a higher removability for the second protective film than the first protective film;
   a first thermal curing for thermally curing the first protective film after the first protective film forming and before the second protective film forming, and
   a second thermal curing for thermally curing the second protective film after the second protective film forming; wherein
   an elastic modulus of the second protective film is higher than an elastic modulus of the first resist.

7. The manufacturing method of the semiconductor device according to claim 6, wherein after the second thermal curing, a thickness of the second protective film is thinner than a thickness of the first protective film.

8. The manufacturing method of the semiconductor device according to claim 6, wherein the second protective film is provided in a wider range than the first protective film in a top view.

9. The manufacturing method of the semiconductor device according to claim 6, wherein in the back surface processing,
   a second resist is provided on the second surface of the semiconductor substrate and then the second surface is processed, and a degassing amount of the second protective film is less than a degassing amount of the second resist.

10. The manufacturing method of the semiconductor device according to claim 6, wherein the elastic modulus of the second protective film is higher than an elastic modulus of a third resist used in patterning the first protective film.

11. The manufacturing method of the semiconductor device according to claim 6, wherein the support stand has a concavo-convex on a surface holding the second protective film.

12. The manufacturing method of the semiconductor device according to claim 6, wherein the organic solvent includes alkanolamine.

13. The manufacturing method of the semiconductor device according to claim 6, wherein the second protective film is a polyimide film.

14. The manufacturing method of the semiconductor device according to claim 6, wherein a thermal curing temperature in the second thermal curing is lower than a thermal curing temperature in the first thermal curing.

15. The manufacturing method of the semiconductor device according to claim 14, wherein after the second thermal curing, a thickness of the second protective film is thinner than a thickness of the first protective film.

16. The manufacturing method of the semiconductor device according to claim 14, wherein the second protective film is provided in a wider range than the first protective film in a top view.

17. The manufacturing method of the semiconductor device according to claim 14, wherein the elastic modulus of the second protective film is higher than an elastic modulus of a third resist used in patterning the first protective film.

18. The manufacturing method of the semiconductor device according to claim 14, wherein in the back surface processing, a second resist is provided on the second surface of the semiconductor substrate and then the second surface is processed, and a degassing amount of the second protective film is less than a degassing amount of the second resist.

19. The manufacturing method of the semiconductor device according to claim 18, wherein the organic solvent includes ethanolamine or isopropanolamine.

20. The manufacturing method of the semiconductor device according to claim 19, wherein the organic solvent is a mixture of glycol ether and alkanolamine.

21. A manufacturing method of a semiconductor device comprising a semiconductor substrate which includes a first surface and a second surface which is on an opposite side of the first surface, the method comprising:

a front surface processing for providing a first resist to the first surface of the semiconductor substrate and processing the first surface;

a first protective film forming for forming a first protective film above the first surface of the semiconductor substrate;

a second protective film forming for forming a second protective film above the first protective film, wherein a material of the second protective film is different from that of the first protective film;

a back surface processing for holding the second protective film on a support stand and processing the second surface of the semiconductor substrate; and a protective film removing for selectively removing the second protective film by an organic solvent which has a higher removability for the second protective film than the first protective film; wherein an elastic modulus of the second protective film is higher than an elastic modulus of the first resist, and the second protective film has a higher swellability than the first protective film.

* * * * *